United States Patent
Lee

(10) Patent No.: US 7,633,186 B2
(45) Date of Patent: Dec. 15, 2009

(54) MAGNETIC LEVITATION WAFER STAGE, AND METHOD OF USING THE STAGE IN AN EXPOSURE APPARATUS

(75) Inventor: Seok-Kyun Lee, Suwon-si (KR)

(73) Assignee: Samsung Electric Co., Ltd., Suwon-si, Gyeonggi-do (KR)

( * ) Notice: Subject to any disclaimer, the term of this patent is extended or adjusted under 35 U.S.C. 154(b) by 311 days.

(21) Appl. No.: 11/783,482

(22) Filed: Apr. 10, 2007

(65) Prior Publication Data

US 2008/0094603 A1    Apr. 24, 2008

(30) Foreign Application Priority Data

Oct. 23, 2006    (KR) .................... 10-2006-0102676

(51) Int. Cl.
*H02K 41/00*    (2006.01)

(52) U.S. Cl. .......................................... 310/12; 355/77
(58) Field of Classification Search .................. 310/12, 310/13, 90.5; 355/72; 361/267
See application file for complete search history.

(56) References Cited

U.S. PATENT DOCUMENTS

| | | | | |
|---|---|---|---|---|
| 5,150,153 A * | 9/1992 | Franken et al. | ................. | 355/53 |
| 5,196,745 A | 3/1993 | Trumper | | |
| 5,815,246 A * | 9/1998 | Sperling et al. | ................ | 355/53 |
| 6,417,914 B1 * | 7/2002 | Li | ............................. | 310/12.06 |
| 6,603,531 B1 * | 8/2003 | Binnard | ........................ | 355/53 |
| 6,952,254 B2 | 10/2005 | Korenaga | | |
| 7,378,764 B2 * | 5/2008 | Tosiya | ...................... | 310/12.06 |

* cited by examiner

*Primary Examiner*—Hae Moon Hyeon
(74) *Attorney, Agent, or Firm*—Volentine & Whitt, PLLC

(57) ABSTRACT

A magnetic levitation wafer stage is used to align a wafer in an exposure apparatus of photolithographic equipment. The wafer stage includes a base, a table supported on the base and whose entire top surface exhibits magnetism of a single polarity, and motors for moving the table in the X and Y directions relative to the base. Alternatively, the wafer stage includes a wafer table having a main body and a number of electromagnets disposed in an upper portion of the main body, and electronics that selectively supply current in either direction through coils of the electromagnets respectively and independently of one another. In the exposure process, the bottom surface of the substrate is provided with a magnetic substance such that the substrate exhibits magnetism of a given polarity. The substrate is delivered to and set on the table of the stage. There, the substrate is levitated by a magnetic force of repulsion between the substrate and the table. The substrate can be moved horizontally while the substrate remains levitated above the table of the stage.

7 Claims, 7 Drawing Sheets

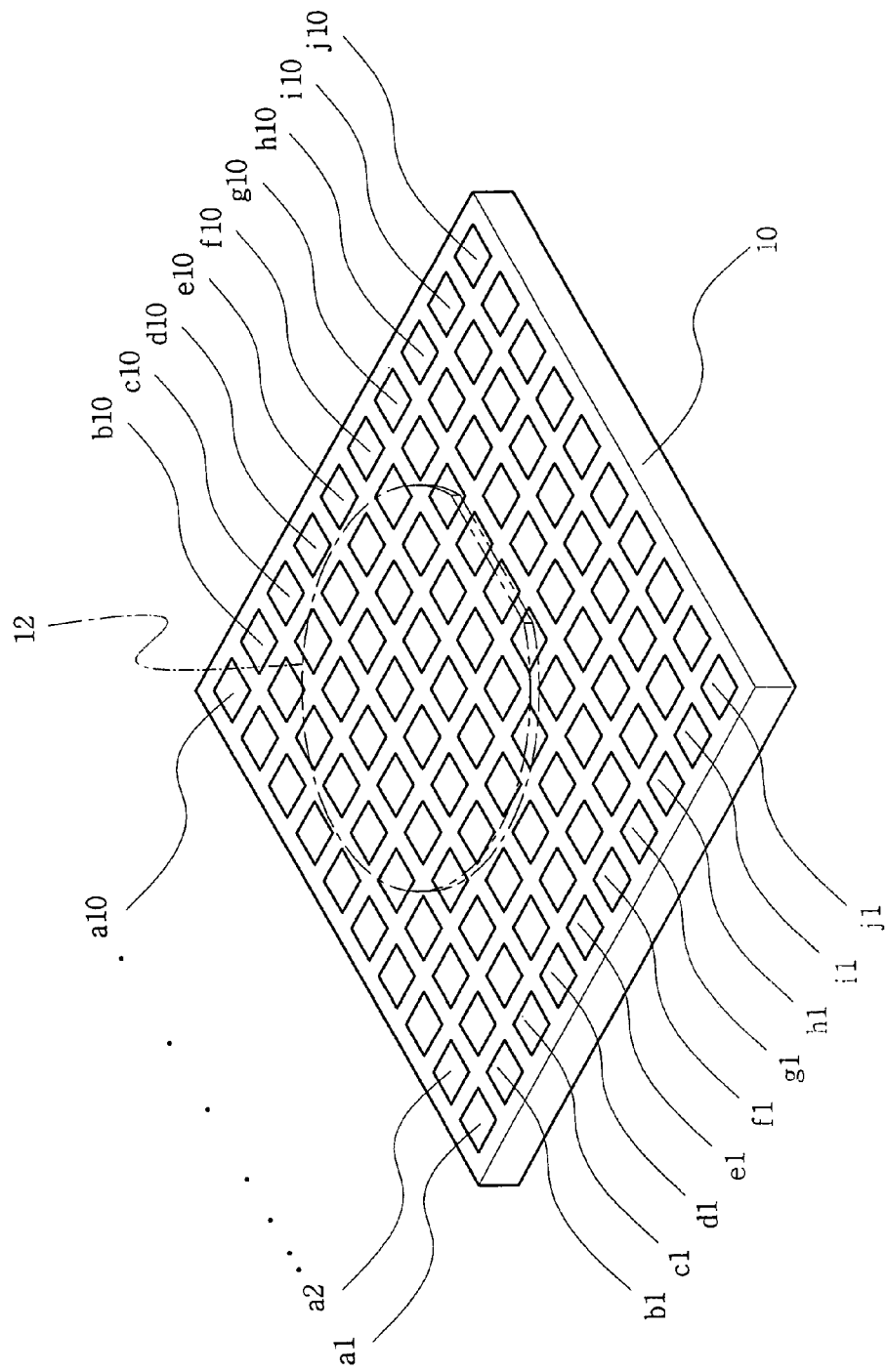

MAGNETIC LEVITATION WAFER STAGE, AND METHOD OF USING THE STAGE IN AN EXPOSURE APPARATUS

BACKGROUND OF THE INVENTION

1. Field of the Invention

The present invention relates to a wafer stage of a photolithographic exposure apparatus. More particularly, the present invention relates to a magnetic levitation wafer stage which levitates a wafer to be exposed.

2. Description of the Related Art

Typically, a wafer used for fabricating a semiconductor device is repeatedly and selectively subjected to individual processes such as cleaning, diffusion, photo-resist coating, exposure, development, etching, and ion-implantation processes. These processes are performed by respective apparatuses. There are several types of exposure apparatus for performing the exposure process. Among these apparatus is a stepper. A stepper is used to direct light from a light source through a reticle, and to scan a layer of photo-resist on the surface of the wafer with the light directed through the reticle. The reticle bears a pattern corresponding to that of a circuit pattern or the like. The layer of photo-resist is thus exposed to an image of the pattern of the reticle. The exposed layer of photo-resist is then developed to remove the exposed (or non-exposed) regions of the layer and thereby pattern the layer of photoresist. The underlying layer is then etched using the patterned layer of photo-resist as a mask. Accordingly, a pattern corresponding to that of the reticle is formed on the wafer.

Generally, the wafers are exposed one-by-one in the stepper. To this end, a predetermined number of wafers coated with photo-resist are loaded in a carrier and the carrier is transferred to a loading/unloading station inside the stepper. Then, a robot arm having a blade is extended to insert the blade into the carrier beneath a wafer. Next, the table is moved down so that the wafer is supported by the blade, and the robot arm is retracted to remove the wafer from the carrier. Once the wafer is removed from the carrier, the wafer is transferred from the blade to a horizontally movable member of a transfer device. The horizontally movable member loads the wafer onto a wafer stage of the stepper. The wafer stage of the stepper aligns each die (region) of the wafer with the reticle whereupon the exposure of the die commences, and the wafer stage moves the wafer so that the dies are exposed sequentially.

The wafer stage has a ceramic chuck (table) and a driving device for moving the chuck. The ceramic chuck holds the wafer, and the driving device moves the ceramic chuck in X and Y (orthogonal) directions. A transfer arm unloads the wafer from the ceramic chuck once the exposure of the wafer has been completed.

During the above-described operation, particles are generated from the back of the wafer or elsewhere in a vacuum chamber in which the wafer stage is disposed. The particles accumulate on the ceramic chuck. Such particles may cause defocus, i.e., an inability of the exposure apparatus to properly focus the image of the pattern of the reticle on the wafer. Therefore, after a certain number of wafers have been exposed, an engineer stops the operation of the exposure apparatus whereupon the pressure in the vacuum chamber of the exposure apparatus is returned to atmospheric pressure. The engineer then takes the wafer stage out of the apparatus, and cleans the ceramic chuck to remove any particles on the chuck.

U.S. Pat. No. 5,196,745 discloses a positioning device (a stage) that can prevent defocus errors from occurring. The positioning device disclosed in U.S. Pat. No. 5,196,745 has a table (wafer chuck) that is magnetically suspended so as to be out of contact with a stationary member in which the table is received. Permanent magnets are arrayed in two dimensions on both top surface and bottom surface of the table. The permanent magnets are arranged, in each direction of the array, such that the adjacent poles of the magnets are of opposite polarity. Also, a multiphase coil array corresponding to the permanent magnets is mounted to the stationary member, in which the table is received, for suspending the table and driving the table in horizontal directions.

However, the table of the non-contact type of positioning device disclosed in U.S. Pat. No. 5,196,745 is relatively large and heavy because the table has a plurality of permanent magnets on the top and bottom surfaces thereof. Moreover, the multiphase coil array can only produce a considerably weak magnetic field in a vertical direction. Therefore, it is difficult to devise a working embodiment in which the multiphase coil array suspends such a heavy table satisfactorily.

SUMMARY OF THE INVENTION

Therefore, an object of the present invention is to provide a magnetic levitation stage having a relatively lightweight table.

Another object of the present invention is to provide a magnetic levitation stage which can obviate defocusing errors caused by particles in an exposure apparatus of photolithographic equipment.

Likewise, an object of the present invention is to provide a method for use in aligning a substrate in an exposure apparatus of photolithographic equipment, which method will not be subject to defocus errors when particles are produced in the equipment.

Still another object of the present invention is to provide a magnetic levitation stage that can be operated using relatively small amounts of power (mechanical or electrical).

Similarly, an object of the present invention is to provide a method for use in aligning a substrate in an exposure apparatus of photolithographic equipment, which method can be carried out using relatively small amounts of power (mechanical or electrical).

In accordance with one aspect of the present invention, there is provided a magnetic levitation stage comprising a base, a table supported on the base and whose entire top surface exhibits magnetism of a single polarity, and motors for moving the table in the X and Y directions relative to the base. In addition, Y-directional members each extending longitudinally in the Y direction are symmetrically disposed at opposite sides of an upper part of the base, and an X-directional member extending longitudinally in the X direction spans the Y-directional members. The X-directional member is supported so as to be movable in the Y direction. The table is engaged with the X-directional member so as to move therewith in the Y direction, and the table is supported so as to be movable in the X direction. The motors include a first motor connected to the X-directional member and operative to reciprocate the X-directional member in the Y direction, and a second motor connected to the table and operative to reciprocate the table in the X direction A substrate, e.g., a wafer, is levitated by the stage. To this end, the bottom surface of the substrate has a coating of a magnetic substance exhibiting the same polarity as that at the upper surface of the table of the stage. Preferably, films comprising the magnetic substance are adhered to the bottom surface of the substrate and an upper surface of the body of the table, respectively.

In accordance with another aspect of the present invention, there is provided a magnetic levitation stage comprising a table including a main body and a number of electromagnets disposed in an upper portion of the main body, and electronics operatively connected to the electromagnets. Preferably, the electromagnets are arrayed in rows and columns in the upper surface of the main body of the table. The electronics are configured to supply current in either direction through coils of the electromagnets respectively and independently of one another.

Preferably, the electronics include a main control unit, a position controlling unit, and an electromagnetic driving circuit. The main control unit is configured to generate a command signal calculated to position a magnetic substrate at a desired location on the table. The position controlling unit is operatively connected to the main control unit to receive the command signal from the main control unit. The position control unit is also configured to determine on the basis of the command signal a polarity of each of the electromagnets, and to output signals corresponding to the polarity of each of the electromagnets. The electromagnetic driving circuit is operatively connected to the position controlling unit to receive the signals output by the position controlling unit. The electromagnetic driving circuit is also configured to supply electric current to the electromagnets in directions through the coils on the basis of the signals output by the position controlling unit. In the case in which the electromagnets are arrayed in rows and columns in the upper surface of the main body of the table, the command signal represents X and Y coordinates, in a Cartesian coordinate system, of the desired location of the substrate.

In accordance with another aspect of the present invention, there is provided a method for use in aligning a substrate in an exposure apparatus of photolithographic equipment, wherein a substrate having a magnetic substance at the bottom surface thereof is provided, the substrate is levitated above a table whose upper surface exhibits magnetism of the same polarity as that at the bottom of the substrate, and the substrate is moved horizontally while the substrate remains levitated above the table. Either the table can be moved while the substrate remains levitated above the table to thereby drag the wafer along with the table or the substrate itself can be moved relative to the table by changing the polarity of the magnetism exhibited at respective regions of the table.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which:

FIG. 4 is a perspective view of a table of another embodiment of a wafer stage according to the present invention;

DETAILED DESCRIPTION OF THE PREFERRED EMBODIMENTS

The present invention will now be described more fully hereinafter with reference to the accompanying drawings. However, the function and constitution of those parts of the present invention and/or devices associated therewith which are well-known in art per se will not be described in detail for the sake of brevity and so that the description of the fundamental aspects of the present invention is not obscured.

Figure 1:
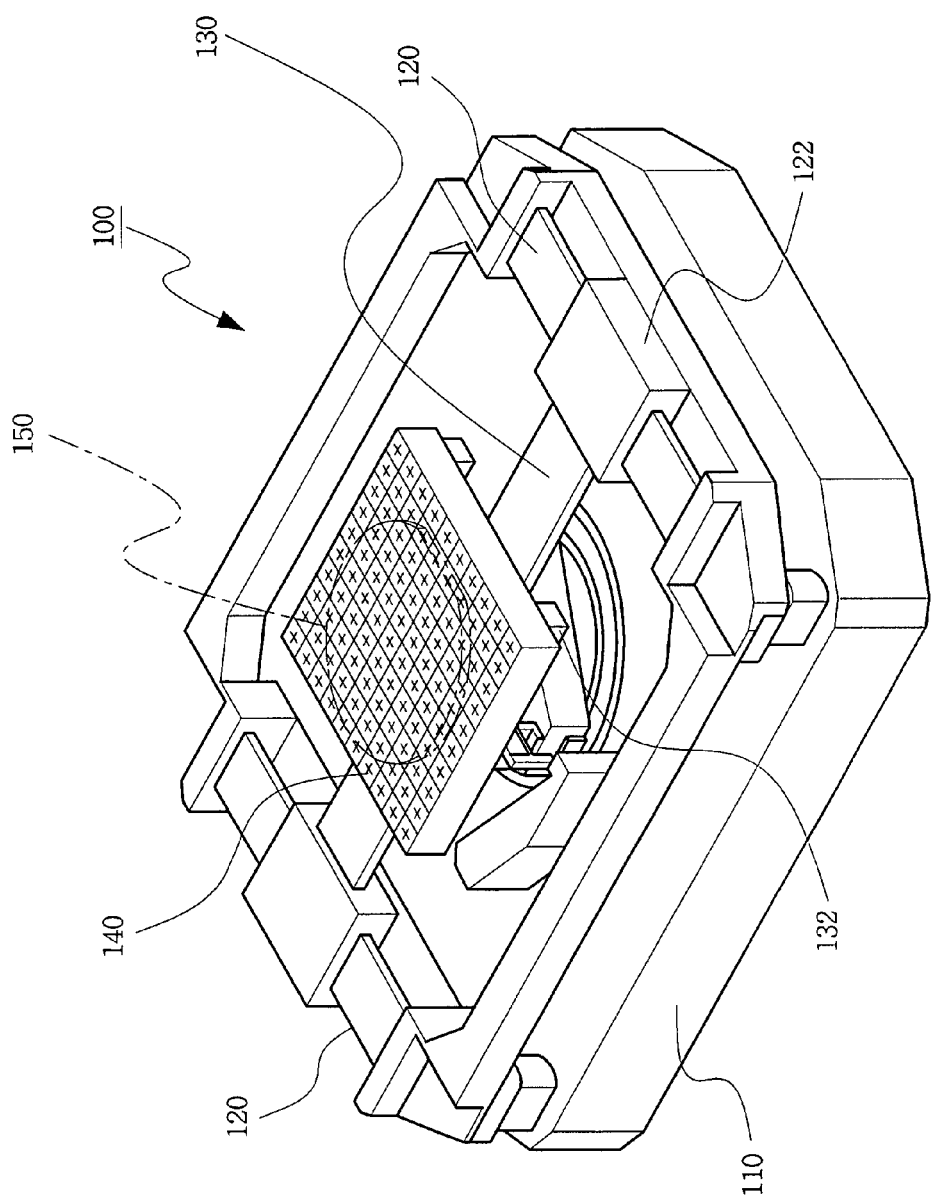
FIG. 1 is a perspective view of a wafer stage according to the present invention.

Referring now to FIG. 1, a wafer stage 100 installed inside a vacuum chamber of an exposure apparatus, according to the present invention, includes a base 110, Y-directional members 120 symmetrically disposed at ends of an upper part of the base 110, an X-directional member 130 spanning the Y-directional movable members 120, a first driving motor 122 engaged with one of the Y-directional movable members 120 and to which the X-directional member 130 is attached, a second driving motor 132 engaged with the X-directional member 130, and a table 140 for supporting a wafer 150 in a magnetically levitated state. The table 140 is disposed on the X-directional movable member 130 so as to move therewith in a Y direction and so as to be movable therealong in an X direction as will be described in more detail below. The wafer 150 may be set atop the table 140 by a transfer robot (not shown).

Figure 2:
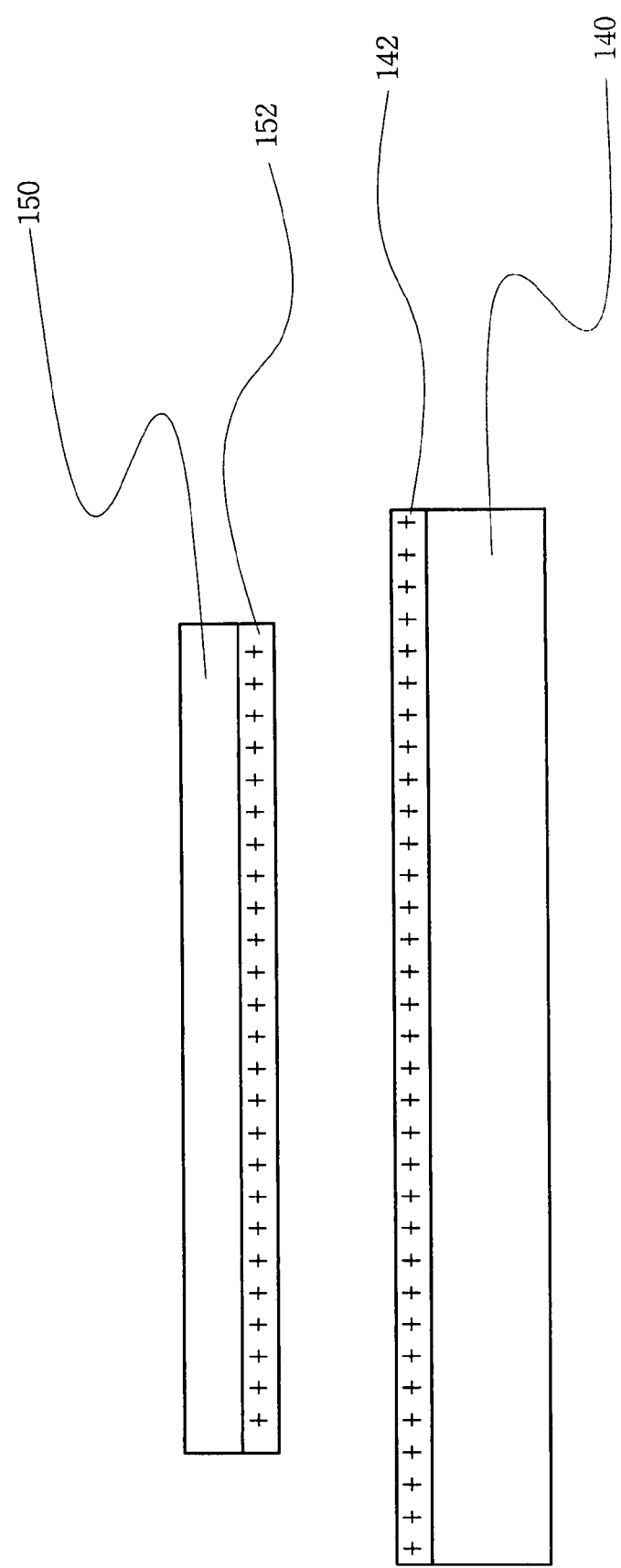
FIG. 2 is a side view of a wafer levitated above a table of the wafer stage of FIG. 1.
Figure 3A:
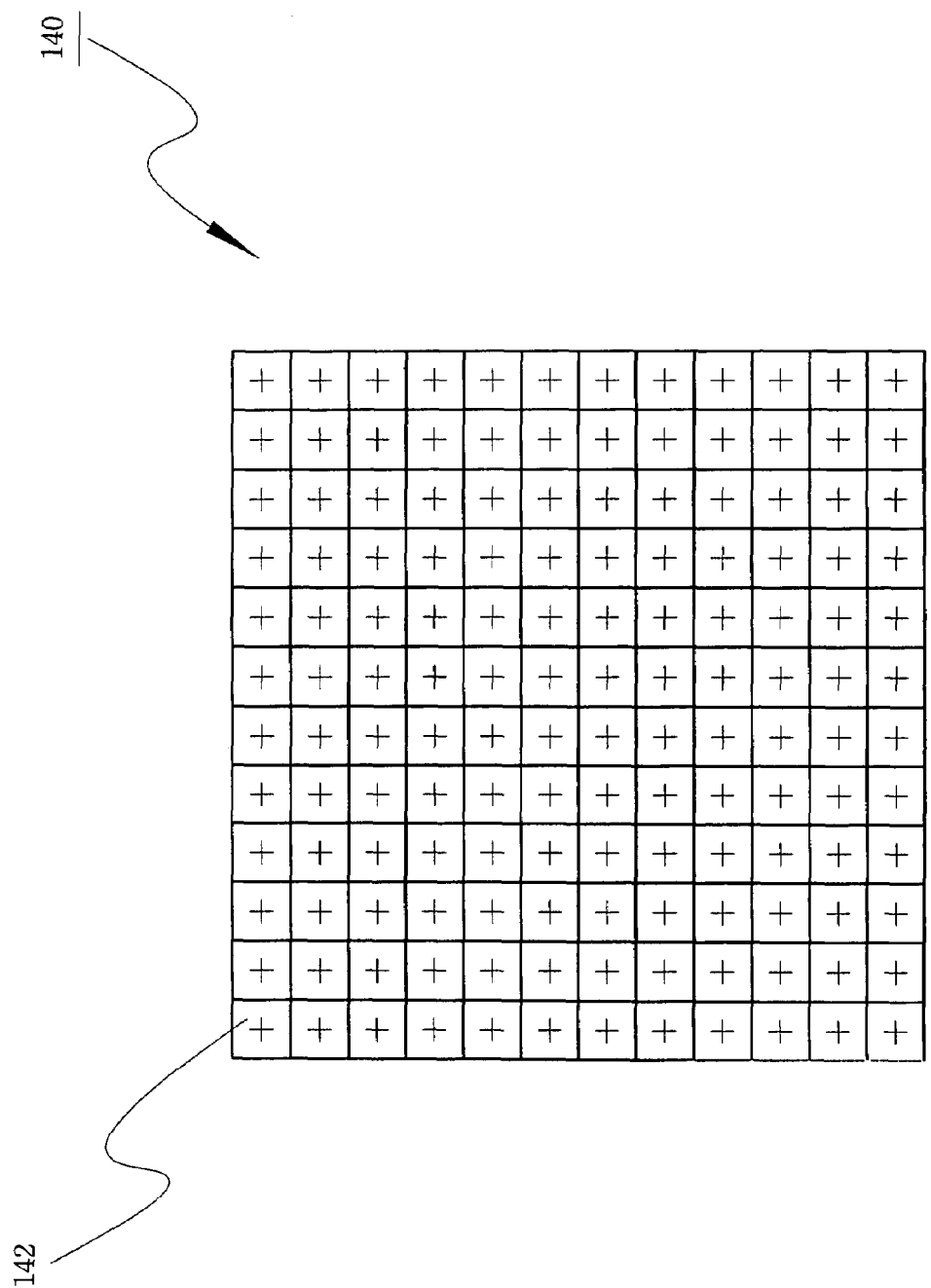
FIG. 3a is a plan view of the table.
Figure 3B:
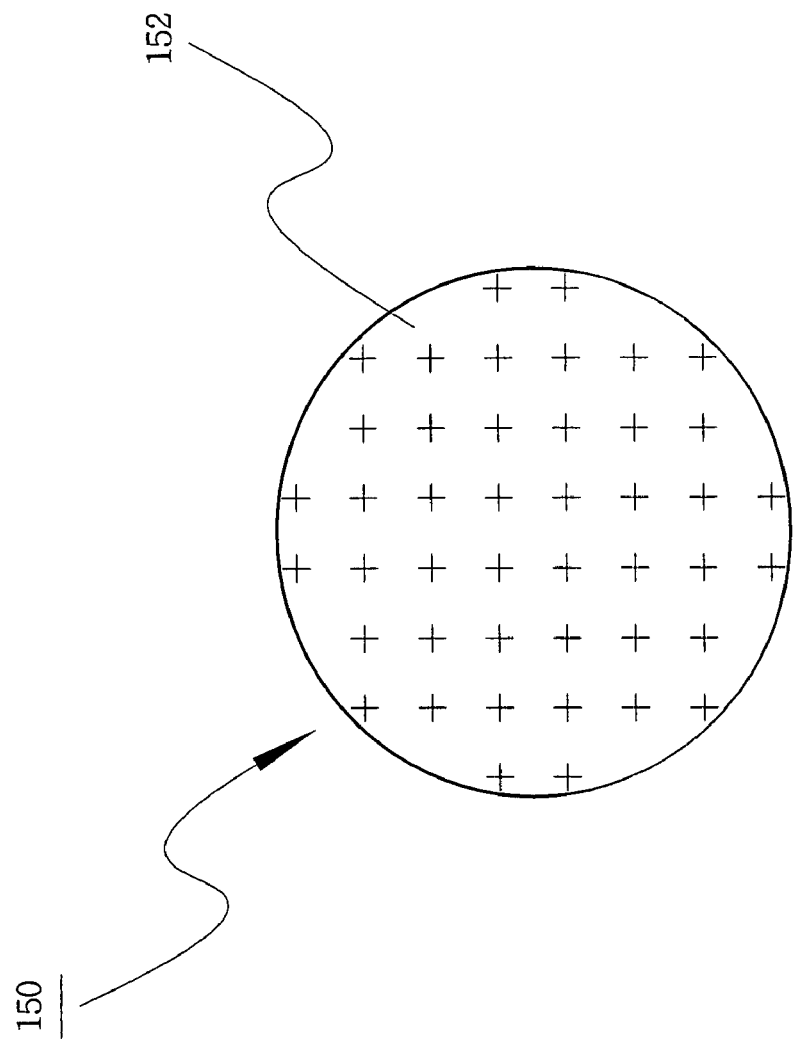
FIG. 3b is a bottom view of the wafer.

Referring also to FIGS. 2, 3a and 3b, the top surface of the table 140 is constituted by a first coating 142 including a magnetic substance of positive polarity. Also, a second coating 152 including a magnetic substance of positive polarity is formed on the bottom surface of the wafer 150. The first and second coatings 142 and 152 may be formed at the top surface of the table 140 and the bottom surface of the wafer 150, respectively. Alternatively, the first and second coatings 142 and 152 may be respective films, each including a magnetic substance, and adhered to the upper surface of a body of the table 140 and the bottom surface of the wafer 150.

The wafer 150 is levitated above the table 140 by a force of repulsion between the first coating 142 of the table 140 and the second coating 152 of the wafer 150. The force of repulsion is created because the first coating 142 of the table 140 and the second coating 152 of the wafer 150 both have positive polarities.

Also, the first driving motor 122 can drive itself along the Y-directional movable member 120 with which it is engaged so as to move in a Y direction parallel to the Y-directional members 120. Thus, the first driving motor 122 drives the X-directional member 130 and the table 140 in the Y direction. On the other hand, the second driving motor 132 can drive itself along the X-directional member 130 so as to move in an X direction parallel to the X-directional member 130. Thus, the second driving motor 132 drives the table 140 in the X direction. In this way, the wafer 150 is levitated above the table 140, and the table 140 is selectively moved in X and Y directions to facilitate an exposure process. In this respect, there is enough drag between the table 140 and the wafer 150 to move the wafer 150 along with the table as the table 140 is moved by the motors.

FIG. 4 illustrates a table 10 of another embodiment of a wafer stage according to the present invention, and a wafer 12 whose bottom surface includes a magnetic substance having a positive polarity. The wafer 12 can be transferred onto the table 10 by a transfer robot (not shown) at which time the table 10 magnetically levitates the wafer 12. To this end, several electromagnets a1-a10, b1-b10 . . . j1-j10 are embedded in the upper surface of the wafer table 10. The electromagnets are arrayed in rows (1-10) and columns (a-j), i.e., in two dimensions. The polarity of each of the electromagnets a1-a10, b1-b10 . . . j1-j10 depends on the direction of current flowing through the coil of the electromagnet.

Figure 5:
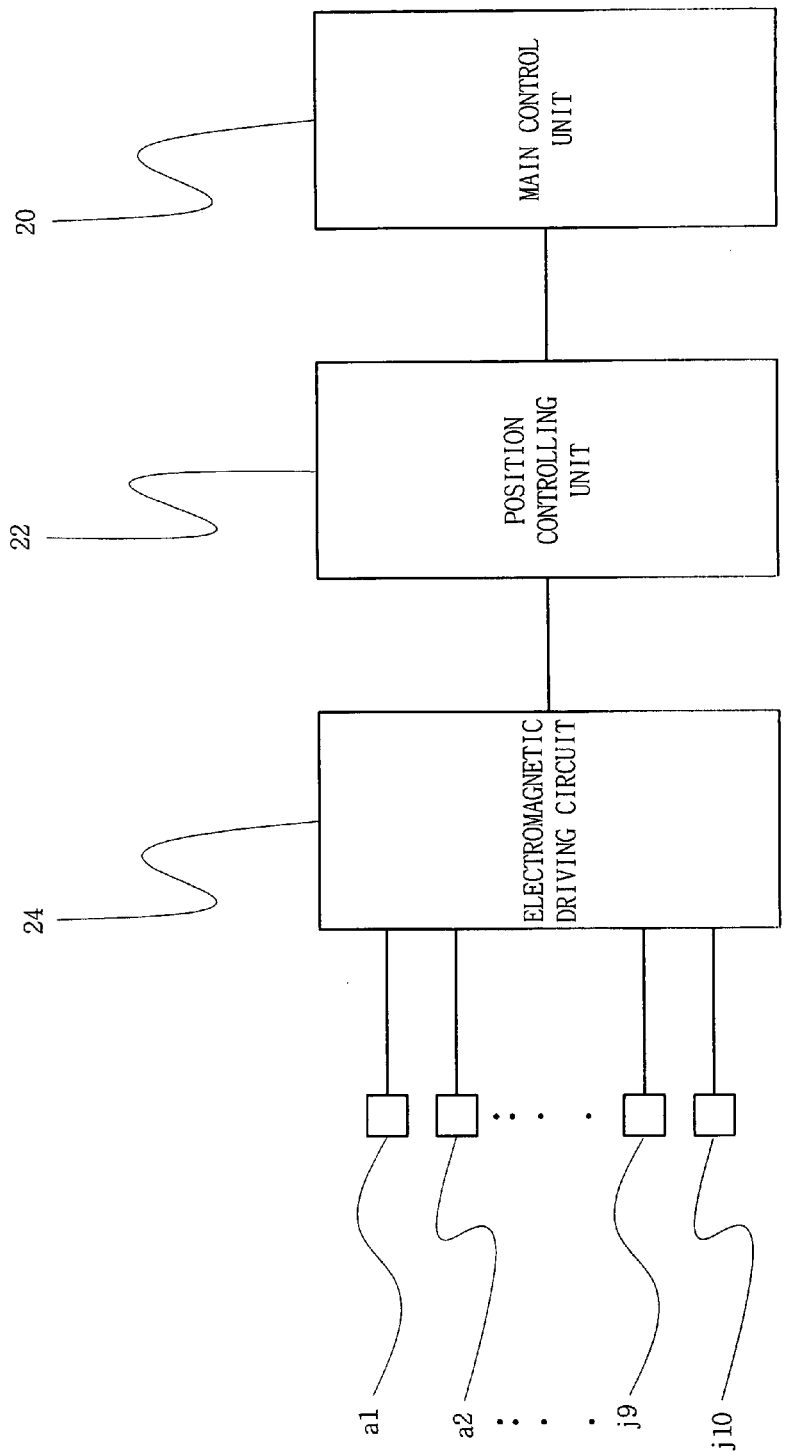
FIG. 5 is a block diagram of a driving device for driving the table of FIG. 4.

Referring to FIG. 5 electronics for driving the electromagnets of the wafer table 10 includes a main control unit 20, a position controlling unit 22 operatively connected to the main control unit 20, and an electromagnetic driving circuit 24 operatively connected to the position controlling unit 22 and to the electromagnets a1-a10, b1-b10 . . . j1-j10. The main control unit 20 generates a control command to position the wafer 12 at a desired location represented by X and Y coordinates of a Cartesian coordinate system. The position controlling unit 22 receives the control command from the main control unit 20 and, on the basis of the control command, determines a polarity (positive or negative) of each of the electromagnets a1-a10, b1-b10 . . . j1-j10 that will effect the movement of the wafer 12 to the desired location on the table 10, and outputs corresponding polarity determinative signals to the electromagnetic driving circuit 24. The electromagnetic driving circuit 24 receives the polarity determinative signals output by the position controlling unit 22 and, on the basis of such signals, supplies electric current to the electromagnets a1-a10, b1-b10 . . . j1-j10 in such directions that the electromagnets a1-a10, b1-b10 . . . j1-j10 keep the wafer 12 magnetically levitated and simultaneously move the wafer 12 to the desired location on the table 10.

Figure 6:
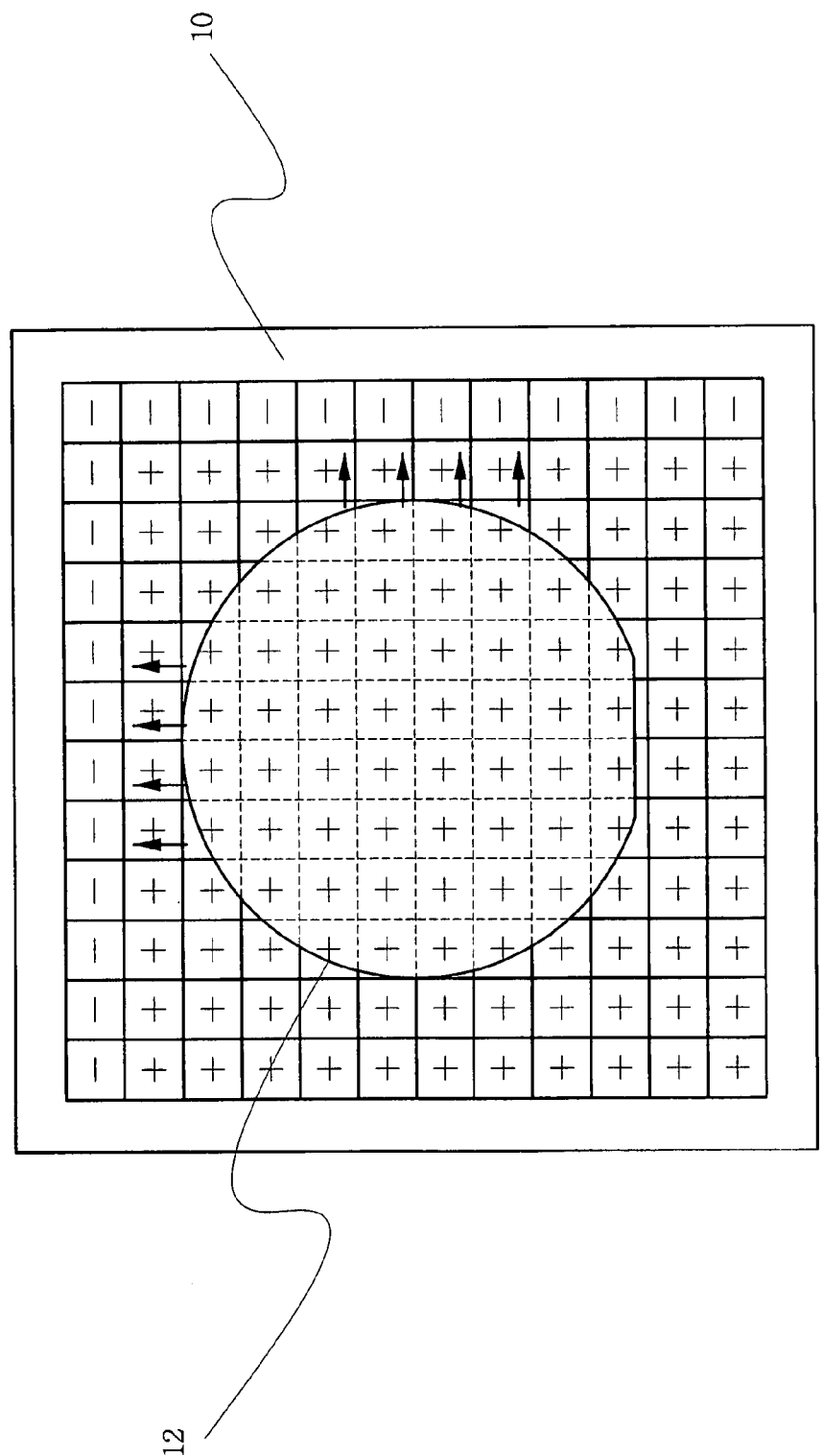
FIG. 6 is an explanatory diagram illustrating an operation of moving a wafer magnetically levitated above the table of a wafer stage according to the present invention.

FIG. 6 illustrates how the electromagnets a1-a10, b1-b10 . . . j1-j10 move the wafer 12 while keeping the wafer 12 magnetically levitated above the table 10.

Assuming that the magnetic coating of the wafer 12 exhibits a positive polarity at the bottom of the wafer 12, the electromagnetic driving circuit 24 initially supplies electric current to all of the electromagnets a1-a10, b1-b10 . . . j1-j10 in such directions that the magnetism produced by each of the electromagnets a1-a10, b1-b10 . . . j1-j10 has a positive polarity above the surface of the table 10. Accordingly, the wafer 12 is levitated by the force of repulsion between the positive magnetic force produced by the electromagnets a1-a10, b1-b10 . . . j1-j10 and the positive magnetic force produced by the magnetic coating of the wafer 12.

To move the wafer 12 levitated above the table 10 to the right, as shown in FIG. 6, electric current is supplied by the electromagnetic driving circuit 24 to the electromagnets a10, b10 . . . j10, namely to the electromagnets arrayed along the right side of the table 10, for a predetermined time and in such directions through the cores of the electromagnets a10, b10 . . . j10 that the polarity of the magnetism produced by these electromagnets a10, b10 . . . j10 above the surface of the table 10 is negative. Accordingly, the wafer 12 is attracted in the direction of the negative magnetic field lines produced by the electromagnets a10, b10 . . . j10 above the surface of the table 10 such that the wafer 12 is moved towards the right side of the table 10 while it is levitated.

Likewise, to move the wafer 12 towards the end of the table, as shown at the top of FIG. 6, the electromagnetic driving circuit 24 supplies electric current for a predetermined time to the electromagnets a1, a2 . . . a10, namely the electromagnets arrayed on the end of the wafer table 10, such that these electromagnets a1, a2 . . . a10 produce magnetism having a negative polarity above the surface of the table 10. As a result, the wafer 12 is attracted in the direction of the negative magnetic field lines produced by the electromagnets a1, a2 . . . a10 above the surface of the table 10 such that the wafer 12 is moved towards the end of the table 10 while it is levitated. Similar operations can be used to move the wafer 12 towards the other side of the table 10 (the left side in FIG. 6) or towards the other end of the table 10 (the end shown at the bottom of FIG. 6). Also, these operations can be used in combination to basically set the wafer 12 at any relative location on the table 10.

The electromagnets a1-a10, b1-b10 . . . j1-j10 can be superconducting electromagnets. That is, the coils of the electromagnets a1-a10, b1-b10 . . . j1-j10 can be of a superconducting metal. For example, the coils of the electromagnets a1-a10, b1-b10 . . . j1-j10 are formed of a niobium-titanium alloy. Superconductivity is a condition in which certain metal materials exhibit zero electrical resistance at extremely low temperatures close to absolute zero (−237 degrees Celsius). Therefore, for a given voltage, the electric current flowing through the superconducting electromagnets and hence, the strength of the magnetic fields produced by the superconducting electromagnets, is relatively high.

As described above, the wafer stage according to the present invention magnetically levitates a wafer above the wafer table by a magnetic force of repulsion between the wafer and the wafer table. Consequently, the present invention prevents the back of the wafer from being mechanically abraded. Thus, the present invention can prevent defocusing errors when the wafer stage is employed in an exposure apparatus of photolithographic equipment. Also, in the case in which the table has the magnetic substance forming the upper surface thereof, the table can be lightweight. Thus, the table can be moved using a relatively small amount of mechanical power. Accordingly, the motors can be correspondingly small and the mechanical system produces very little abrasion. In the case in which the table is provided with electromagnets, the relatively lightweight wafer can be levitated easily using a relatively small amount of electrical power and the wafer is moved without any abrasion occurring.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. For example, although the present invention has been described above in connection with the forming of magnetism having positive polarities at the bottom of the wafer and at the upper surface of the table of the wafer stage, the present invention is not so limited. Rather, the present invention can be carried out by employing magnetism having negative polarities at the bottom of the wafer and at the upper surface of the table of the wafer stage. Thus, changes to and modifications of the preferred embodiments may fall within the true spirit and scope of the invention as defined by the appended claims.

What is claimed is:

1. A magnetic levitation stage, comprising:
 a base;
 a table supported on the base so as to be movable in X and Y directions orthogonal to each other, and the top surface of the table being constituted by a magnetic substance exhibiting magnetism of a single polarity; and
 motors operatively connected to the table so as to move the table in the X and Y directions relative to the base.

2. The magnetic levitation stage according to claim 1, further comprising Y-directional members symmetrically disposed at opposite sides of an upper part of the base and each extending longitudinally in the Y direction; and an X-directional member spanning the Y-directional members in the X direction, the X-directional member being supported so as to be movable longitudinally of the Y-directional members in the Y direction, the table being engaged with the X-directional member so as to move therewith in the Y direction, and the table being supported so as to be movable longitudinally of the X-directional member in the X direction, and wherein the motors include a first motor connected to the X-directional member and operative to reciprocate the X-directional member in the Y direction, and a second motor connected to the table and operative to reciprocate the table in the X direction.

3. The magnetic levitation stage according to claim 1, wherein the table has a main body, and a film of the magnetic substance extending over an upper surface of the main body.

4. A method for use in aligning a substrate in an exposure apparatus of photolithographic equipment, the method comprising:

providing a substrate having a magnetic substance at the bottom surface thereof wherein the substance exhibits magnetism of a given polarity at the bottom of the substrate, levitating the substrate above a table whose upper surface exhibits magnetism of the same polarity as that at the bottom of the substrate, the substrate being levitated above the table by a magnetic force of repulsion between the magnetic substance and the table; and moving the substrate horizontally while the substrate remains levitated above the table.

5. The method according to claim 4, wherein the providing of the substrate comprises adhering a film which includes the magnetic substance to the bottom surface of the substrate.

6. The method according to claim 4, wherein the moving of the substrate horizontally while the substrate remains levitated above the table comprises moving the table.

7. The method according to claim 6, wherein the moving of the table comprises moving the table selectively in X and Y directions that are orthogonal to each other.

* * * * *